United States Patent
Lei et al.

(10) Patent No.: US 10,685,162 B2
(45) Date of Patent: Jun. 16, 2020

(54) LAYOUT FOR INTEGRATED CIRCUIT AND THE INTEGRATED CIRCUIT

(71) Applicant: TAIWAN SEMICONDUCTOR MANUFACTURING COMPANY LTD., Hsinchu (TW)

(72) Inventors: Cheok-Kei Lei, Andar AC (MO); Yu-Chi Li, Hsinchu (TW); Chia-Wei Tseng, Hsinchu (TW); Zhe-Wei Jiang, Hsinchu (TW); Chi-Lin Liu, New Taipei (TW); Jerry Chang-Jui Kao, Taipei (TW); Jung-Chan Yang, Taoyuan County (TW); Chi-Yu Lu, New Taipei (TW); Hui-Zhong Zhuang, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/228,530

(22) Filed: Dec. 20, 2018

(65) Prior Publication Data

US 2019/0121931 A1    Apr. 25, 2019

Related U.S. Application Data

(62) Division of application No. 15/183,112, filed on Jun. 15, 2016, now Pat. No. 10,163,883.

(51) Int. Cl.
*G06F 30/392* (2020.01)
*G06F 30/394* (2020.01)
*G06F 30/398* (2020.01)

(52) U.S. Cl.
CPC .......... *G06F 30/392* (2020.01); *G06F 30/394* (2020.01); *G06F 30/398* (2020.01)

(58) Field of Classification Search
None
See application file for complete search history.

(56) References Cited

U.S. PATENT DOCUMENTS

2014/0183647 A1*   7/2014   Lu .................. H01L 27/092
                                                         257/369

* cited by examiner

*Primary Examiner* — Moazzam Hossain
*Assistant Examiner* — Stanetta D Isaac
(74) *Attorney, Agent, or Firm* — WPAT, P.C., Intellectual Property Attorneys; Anthony King

(57) ABSTRACT

A layout of an integrated circuit includes: a first layout device; a second layout device abutting the first layout device at a boundary between the first layout device and the second layout device, wherein the second layout device is a redundant circuit in the integrated circuit; a conductive path disposed across the boundary of the first layout device and the second layout device; and a cut layer disposed on the conductive path and nearby the boundary for disconnecting the first layout device from the second layout device by cutting the conductive path into a first conductive portion and a second conductive portion according to a position of the cut layer; wherein the first layout device is a first layout pattern and the second layout device is a second layout pattern different from the first layout pattern.

20 Claims, 22 Drawing Sheets

LAYOUT FOR INTEGRATED CIRCUIT AND THE INTEGRATED CIRCUIT

CROSS-REFERENCE TO RELATED APPLICATION

This application is a divisional application of U.S. application Ser. No. 15/183,112, filed on Jun. 15, 2016.

BACKGROUND

In the design of integrated circuits, particularly digital circuits, standard cells having fixed functions are widely used. Standard cells are typically pre-designed and stored in cell libraries. During an integrated circuit design process, the standard cells are retrieved from the cell libraries and placed in desired locations. Routing is then performed to connect the standard cells with each other and with other circuits on the chip. The conductive paths in each standard cell may incur parasitic effect due to undesirable layout in the standard cell. In advanced semiconductor technology, when millions of standard cells are integrated into a digital circuit, the effective parasitic effect caused by the huge number of standard cells may greatly degrade the speed and the power consumption of the digital circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
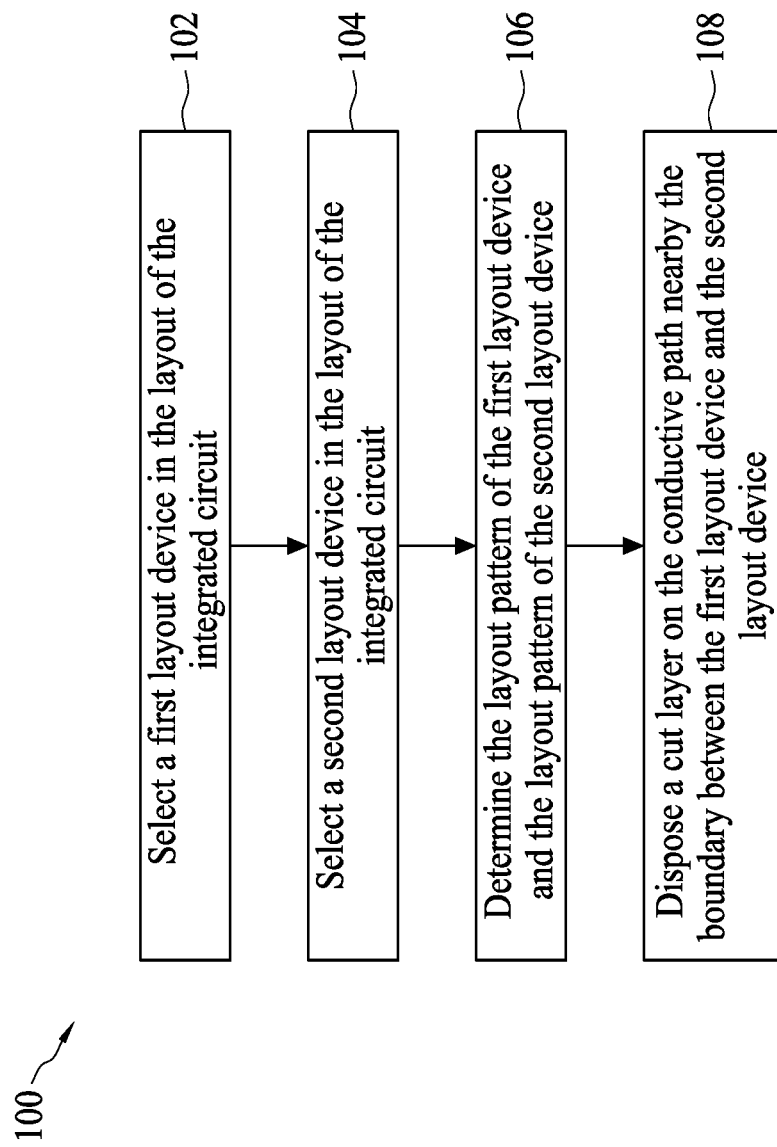
FIG. 1 is a flowchart illustrating a layout method for improving a layout of an integrated circuit according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

FIG. 1 is a flowchart illustrating a layout method 100 for improving a layout of an integrated circuit according to some embodiments. The layout method 100 is executable by a processor or manual. Some of the operations in the layout method 100 may by manually executed. The layout method 100 may be compiled in a computer readable program. The computer readable program may be stored in a memory device. The processor may read or reload the computer readable program from the memory device to execute the layout method 100 upon the layout of the integrated circuit. The layout of the integrated circuit is composed of a plurality of standard cells. Standard cells are typically pre-designed and stored in cell libraries. Generally speaking, the layout method 100 is designed to determine an active circuit and a redundant circuit in the layout of the integrated circuit, wherein the redundant circuit abuts the active circuit, and a conductive path crosses the active circuit and the redundant circuit. Then, the layout method 100 is designed to dispose a cut layer on the conductive path and nearby the boundary between a first device and a second device. The cut layer is a mask used for cutting the conductive path across the active circuit and the redundant circuit. When the conductive path in the redundant circuit is disconnected from the active circuit, parasitic elements, such as parasitic or coupling capacitor, on the conductive path in the redundant circuit is disconnected from the active circuit. Accordingly, when the conductive paths of all redundant circuit are disconnected from their respective active circuits in the integrated circuit, the effective parasitic element of the integrated circuit is reduced. When the parasitic elements in the integrated circuit is reduced, the power consumption performance and the operation speed of the integrated circuit can be improved.

According to some embodiments, the layout method 100 comprises operations 102~108. In operation 102, a first layout device in the layout of the integrated circuit is selected.

In operation 104, a second layout device in the layout of the integrated circuit is selected. The second layout device abuts the first layout device at a boundary between the first layout device and the second layout device.

In operation 106, the layout pattern of the first layout device and the layout pattern of the second layout device are determined to be a first layout pattern or a second layout pattern different from the first layout pattern. According to some embodiments, the first layout pattern corresponds to active circuits in the integrated circuit, and the second layout pattern corresponds to redundant circuits in the integrated circuit. However, this is not a limitation of the present disclosure. The first layout pattern may correspond to redundant circuits in the integrated circuit, and the second layout pattern may correspond to active circuits in the integrated circuit.

In operation 108, when the layout pattern of the first layout device and the layout pattern of the second layout device are determined to be the first layout pattern and the second layout pattern, respectively, a cut layer is disposed on the conductive path and nearby the boundary between the first layout device and the second layout device.

When the cut layer is disposed on the conductive path and nearby the boundary between the first layout device and the second layout device, the layout method 100 repeats the operations 102~108 until all of the conductive paths in the redundant circuits are disposed by the corresponding cut layers.

According to some embodiments, the conductive path is a polysilicon path. For a field-effect transistor (FET), the polysilicon path is disposed on the diffusion area or active area of the field-effect transistor for inducing a magnetic field on the diffusion area. Therefore, the polysilicon path may be regarded as a gate terminal of the field-effect transistor. For brevity, the polysilicon path is a polysilicon path in the following embodiments. However, this is not a limitation of the present disclosure.

According to some embodiments, in operation 106, the layout method 100 is arranged to determine if the first layout device comprises a first contact layer contacting the polysilicon path, and to determine if the second layout device comprises a second contact layer contacting the polysilicon path. If the first layout device comprises the first contact layer contacting the polysilicon path and if the second layout device does not comprise the second contact layer contacting the polysilicon path, the layout method 100 determines that the first layout device is the active layout pattern (or simply the active circuit) and the second layout device is the redundant layout pattern (or simply the redundant circuit).

According to some embodiments, in operation 106, the layout method 100 is arranged to determine if the first layout device comprises a first contact layer for coupling a first diffusion area of the first layout device to a third layout device adjacent to the first layout device, and to determine if the second layout device comprises a second contact layer for coupling a second diffusion area of the second layout device to a fourth layout device adjacent to the second layout device. If the first layout device comprises the first contact layer for coupling the first diffusion area of the first layout device to the third layout device adjacent to the first layout device, and if the second layout device does not comprise the second contact layer for coupling the second diffusion area of the second layout device to the fourth layout device adjacent to the second layout device, the layout method 100 determines that the first layout device is the active layout pattern and the second layout device is the redundant layout pattern.

According to some embodiments, in operation 106, the layout method 100 is arranged to determine if the first layout device comprises a first contact layer for coupling a first diffusion area of the first layout device to a third layout device adjacent to the first layout device, and to determine if the second layout device comprises a second contact layer and a third contact layer for coupling a second diffusion area and a third diffusion area of the second layout device, respectively, to a reference voltage. If the first layout device comprises the first contact layer for coupling the first diffusion area of the first layout device to the third layout device adjacent to the first layout device, and if the second layout device comprises the second contact layer and the third contact layer for coupling the second diffusion area and the third diffusion area of the second layout device, respectively, to the reference voltage, the layout method 100 determines that the first layout device is the active layout pattern and the second layout device is the redundant layout pattern.

According to some embodiments, in operation 106, the layout method 100 is arranged to determine if the first layout device comprises a first contact layer for coupling a diffusion area of the first layout device to a third layout device adjacent to the first layout device, and to determine if the second layout device comprises a second contact layer for contacting the polysilicon path to a reference voltage. If the first layout device comprises the first contact layer for coupling the diffusion area of the first layout device to the third layout device adjacent to the first layout device, and if the second layout device comprises the second contact layer for contacting the polysilicon to the reference voltage, the layout method 100 determines that the first layout device is the active layout pattern and the second layout device is the redundant layout pattern.

According to some embodiments, the active circuit may be a circuit disposed on a signal path of the integrated circuit. The redundant circuit may be a circuit not disposed on the signal path of the integrated circuit.

According to some embodiments, the active circuit may be a circuit capable of relaying signal to/from an adjacent circuit of the active circuit in the integrated circuit. The redundant circuit may be a circuit incapable of relaying signal to/from an adjacent circuit of the redundant circuit in the integrated circuit.

Figure 2:
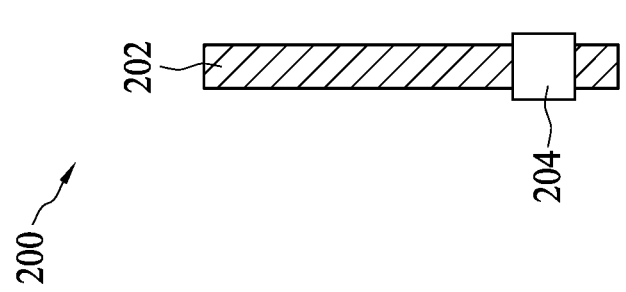
FIG. 2-FIG. 6 are diagrams illustrating active layout devices according to some embodiments.

FIG. 2 is a diagram illustrating an active layout device 200 according to some embodiments. The active layout device 200 may be a portion of layout of an integrated circuit. The active layout device 200 comprises a polysilicon path 202 and a contact layer 204. The contact layer 202 is arranged to electrically couple to the polysilicon path 202. The contact layer 202 is further electrically coupled to an adjacent device (not shown) of the active layout device 200. Accordingly, when the integrated circuit is fabricated, the contact layer 204 is arranged to relay signal between the polysilicon path 202 and the adjacent circuit during the operation.

Figure 3:
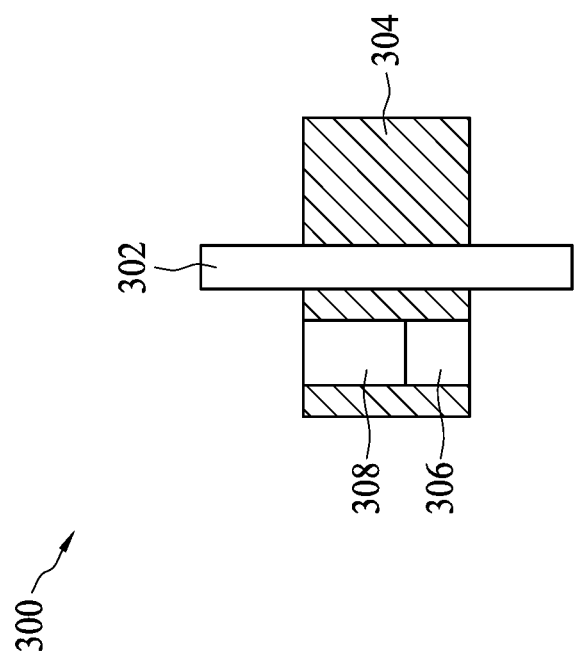

FIG. 3 is a diagram illustrating an active layout device 300 according to some embodiments. The active layout device 300 may be a portion of layout of an integrated circuit. The active layout device 300 comprises a polysilicon path 302, a diffusion area 304, a contact layer 306, and a metal layer 308. The polysilicon path 302 is disposed on the diffusion area 304. The contact layer 306 is disposed on the diffusion area 304. The contact layer 306 is arranged to electrically couple to the diffusion area 304. The metal layer 308 is electrically coupled to the contact layer 306. The metal layer 308 is further electrically coupled to an adjacent device (not shown) of the active layout device 300. Accordingly, when the integrated circuit is fabricated, the contact layer 306 is arranged to relay signal between the diffusion area 304 and the adjacent circuit in response to the signal on the polysilicon path 302 during the operation. According to some embodiments, the active layout device 300 may be the layout of a P-channel metal-oxide-semiconductor field-effect transistor (P-channel MOSFET) or an N-channel MOSFET.

Figure 4:
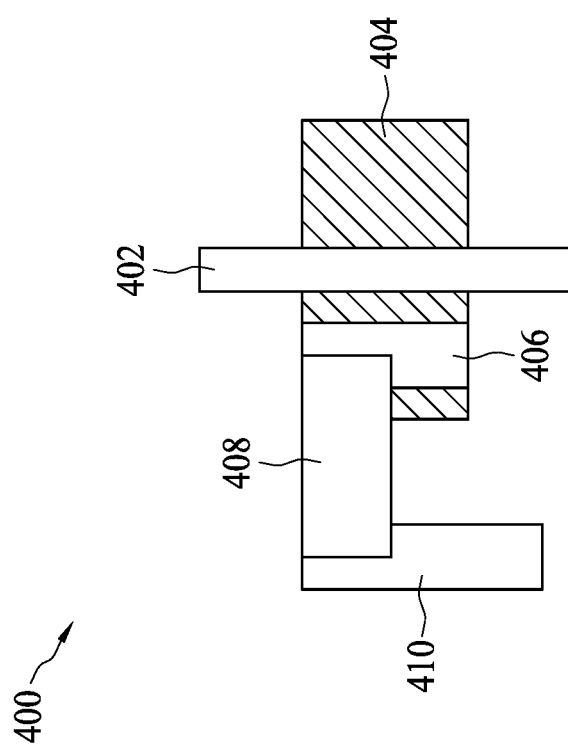

FIG. 4 is a diagram illustrating an active layout device 400 according to some embodiments. The active layout device 400 may be a portion of layout of an integrated circuit. The active layout device 400 comprises a polysilicon path 402, a diffusion area 404, a first metal diffusion (MD) layer 406, a metal poly (MP) layer 408, and a second metal diffusion 410. 406 and 410 are located in same layer called MD layer, Thicknesses of MP and MD are different but MP can horizontally cross poly to connect MD. The polysilicon path 402 is disposed on the diffusion area 404. The first metal diffusion 406 is disposed on the diffusion area 404. The first metal diffusion 406 is arranged to electrically couple to the diffusion area 404. The metal poly layer 408 is electrically coupled to the first metal diffusion 406 and the second metal diffusion 410. The second metal diffusion 410 is electrically coupled to an adjacent device (not shown) of the active layout device 400. Accordingly, when the integrated circuit is fabricated, the first metal diffusion 406 is arranged to relay signal between the diffusion area 404 and the adjacent circuit in response to the signal on the polysilicon path 402 during the operation. According to some embodiments, the active layout device 400 may be the layout of a P-channel MOSFET or an N-channel MOSFET.

Figure 5:
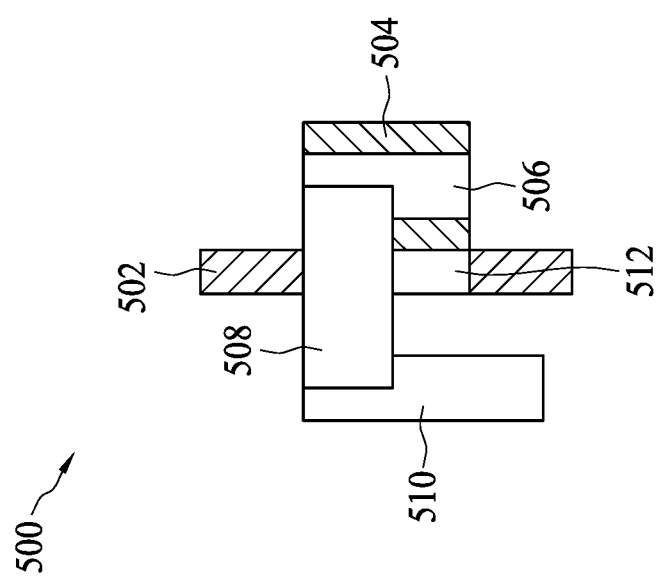

FIG. 5 is a diagram illustrating an active layout device 500 according to some embodiments. The active layout device 500 may be a portion of layout of an integrated circuit. The active layout device 500 comprises a polysilicon path 502, a diffusion area 504, a first metal diffusion layer 506, a metal poly layer 508, and a second metal diffusion 510. 506 and 510 are located in same layer called MD layer. The polysilicon path 502 is disposed on the edge 512 of the diffusion area 504. The polysilicon path 502 may be a poly on oxide diffusion edge (PODE). The first metal layer 506 is disposed on the diffusion area 504. The first metal layer 506 is arranged to electrically couple to the diffusion area 504. The metal poly layer 508 is electrically coupled to the first metal layer 506 and the second metal diffusion 510. The second metal diffusion 510 is electrically coupled to an adjacent device (not shown) of the active layout device 500. Accordingly, when the integrated circuit is fabricated, the first metal layer 506 is arranged to relay signal between the diffusion area 504 and the adjacent circuit in response to the signal on the polysilicon path 502 during the operation. According to some embodiments, the active layout device 500 may be the layout of a P-channel MOSFET with PODE dummy polysilicon and metal polysilicon connection or an N-channel MOSFET with PODE dummy polysilicon and metal polysilicon connection.

Figure 6:
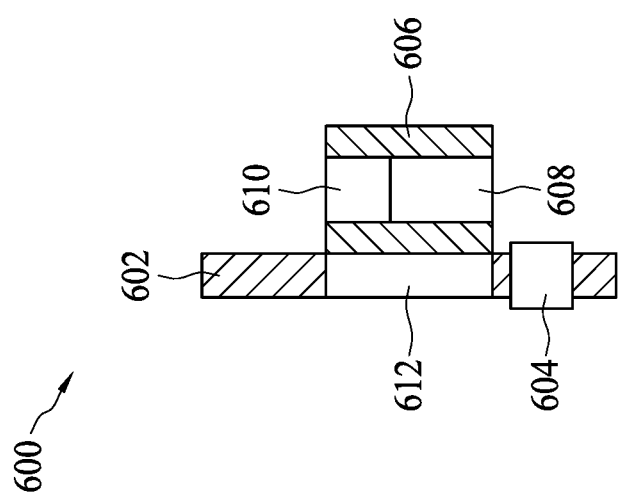

FIG. 6 is a diagram illustrating an active layout device 600 according to some embodiments. The active layout device 600 may be a portion of layout of an integrated circuit. The active layout device 600 comprises a polysilicon path 602, a first contact layer 604, a diffusion area 606, a second contact layer 608, and a metal layer 610. The first contact layer 604 is disposed on the polysilicon path 602. The first contact layer 604 is electrically coupled to the polysilicon path 602. The polysilicon path 602 is disposed on the edge 612 of the diffusion area 606. The edge 612 is called a poly on oxide diffusion edge (PODE). According to some embodiments, in the GDS (Graphic Database System) file of the active layout device 600, the edge 612 is a symbol. In other words, it is a non-tapeout layer, which is invisible in final silicon, is used to indicate an edge of the diffusion area 606. The polysilicon path 602 is arranged to pass through the edge 612. Therefore, the edge 612 is a cut layer used to align the polysilicon path 602 and the oxide diffusion area 606. After the active layout device 600 is fabricated, the portion in the edge 612 becomes the polysilicon path 602. The second contact layer 608 is disposed on the diffusion area 606. The second contact layer 608 is electrically coupled to the diffusion area 606. The metal layer 610 is electrically coupled to the second contact layer 608. The metal layer 610 is electrically coupled to an adjacent device (not shown) of the active layout device 600. Accordingly, when the integrated circuit is fabricated, the second contact layer 608 is arranged to relay signal between the diffusion area 606 and the adjacent circuit in response to the signal on the polysilicon path 602 during the operation, wherein the signal may be received from the first contact layer 604. According to some embodiments, the active layout device 600 may be the layout of a P-channel MOSFET with PODE dummy polysilicon and polysilicon connection or an N-channel MOSFET with PODE dummy polysilicon and polysilicon connection.

Figure 7:
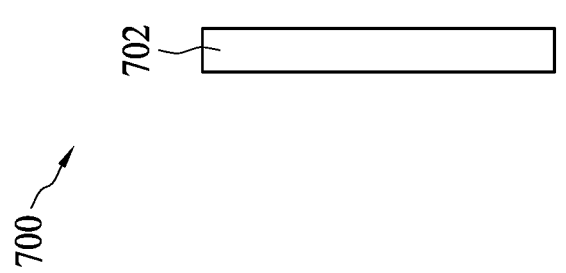
FIG. 7-FIG. 10 are diagrams illustrating passive layout devices according to some embodiments.

FIG. 7 is a diagram illustrating a passive layout device 700 according to some embodiments. The passive layout device 700 may be a portion of layout of an integrated circuit. The passive layout device 700 comprises a polysilicon path 702. The polysilicon path 702 is a floating polysilicon path. According to some embodiments, the polysilicon path 702 is not electrically coupled to an adjacent device (not shown) of the passive layout device 700. Accordingly, the polysilicon path 702 is a redundant polysilicon path in the integrated circuit, and the polysilicon path 702 does not relay signal between the polysilicon path 702 and the adjacent circuit during the operation.

Figure 8:
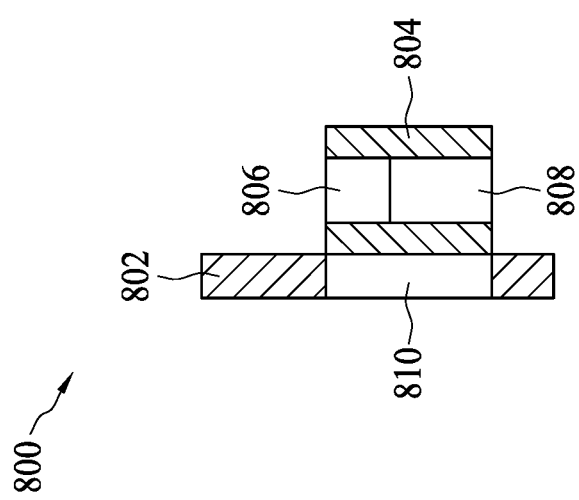

FIG. 8 is a diagram illustrating a passive layout device 800 according to some embodiments. The passive layout device 800 may be a portion of layout of an integrated circuit. The passive layout device 800 comprises a polysilicon path 802, a diffusion area 804, a contact layer 806, and a metal layer 808. The polysilicon path 802 is disposed on the edge 810 of the diffusion area 804. The egde 810 is called a poly on oxide diffusion edge (PODE). According to some embodiments, in the GDS (Graphic Database System) file of the active layout device 800, the edge 810 is a symbol. In other words, it is a non-tapeout layer, which is invisible in final silicon, is used to indicate an edge of the diffusion area 804. The polysilicon path 802 is arranged to pass through the edge 810, Therefore, the edge 810 is a cut layer used to align the polysilicon path 802 and the oxide diffusion area 804. After the active layout device 800 is fabricated, the portion in the edge 810 becomes the polysilicon path 802. The contact layer 806 is disposed on the diffusion area 804. The contact layer 806 may be electrically coupled to the diffusion area 804. The metal layer 808 is electrically coupled to the contact layer 806. The metal layer 808 is not electrically coupled to an adjacent device (not shown) of the passive layout device 800. Accordingly, the diffusion area 804, the contact layer 806, and the metal layer 808 are the floating device in the integrated circuit because the metal layer 808 does not relay signal between the diffusion area 804 and the adjacent circuit during the operation. Therefore, the polysilicon path 802 is regarded as a redundant polysilicon path in the integrated circuit. According to some embodiments, the passive layout device 800 may be the layout of a P-channel MOSFET with PODE dummy polysilicon or an N-channel MOSFET with PODE dummy polysilicon.

Figure 9:
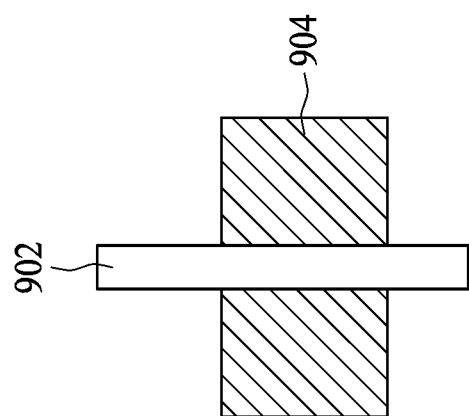

FIG. 9 is a diagram illustrating a passive layout device 900 according to some embodiments. The passive layout device 900 may be a portion of layout of an integrated circuit. The passive layout device 900 comprises a polysilicon path 902 and a diffusion area 904. The polysilicon path 902 is disposed on the diffusion area 904. The diffusion area 904 does not comprise any contact layer contacting thereon. Accordingly, the diffusion area 904 is a floating diffusion area in the integrated circuit because there is no contact layer relaying signal between the diffusion area 904 and the adjacent circuit during the operation. Therefore, the polysilicon path 902 is regarded as a redundant polysilicon path in the integrated circuit. According to some embodiments, the passive layout device 900 may be the layout of a floating P-channel MOSFET or a floating N-channel MOSFET.

Figure 10:
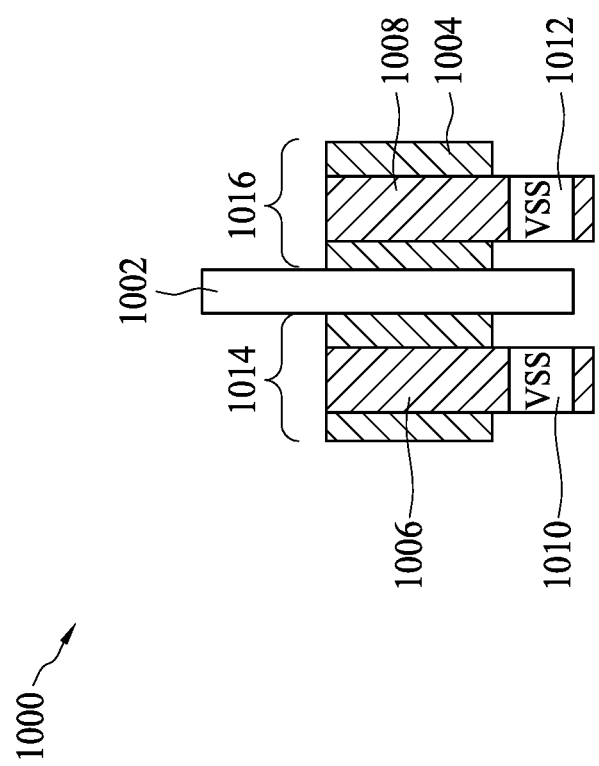

FIG. 10 is a diagram illustrating a passive layout device 1000 according to some embodiments. The passive layout device 1000 may be a portion of layout of an integrated circuit. The passive layout device 1000 comprises a polysilicon path 1002, a diffusion area 1004, a first metal diffusion layer 1006, a second metal diffusion 1008, a first contact layer 1010, and a second contact layer 1012. 1006 and 1008 are located in same layer called MD layer. The polysilicon path 1002 is disposed on the diffusion area 1004 for separating the diffusion area 1004 into a first diffusion area 1014 and a second diffusion area 1016. The first metal diffusion 1006 and the second metal diffusion 1008 are disposed on the first diffusion area 1014 and the second diffusion area 1016, respectively. The first metal diffusion 1006 and the second metal diffusion 1008 are electrically coupled to the first diffusion area 1014 and the second diffusion area 1016 respectively. The first contact layer 1010 and the second contact layer 1012 are electrically coupled to the first metal diffusion 1006 and the second metal diffusion 1008, respectively. The first contact layer 1010 and the second contact layer 1012 are coupled to a reference voltage. According to some embodiments, the reference voltage is the ground voltage VSS of the integrated circuit. However, this is not a limitation of the present disclosure. The reference voltage may be the supply voltage (VDD) of the integrated circuit. When both of the first diffusion area 1014 and the second diffusion area 1016 are coupled to the ground voltage (or supply voltage), the device 1000 is a tie-to-ground (or tie-to-supply) dummy device in the integrated circuit. Therefore, the polysilicon path 1002 is regarded as a redundant polysilicon path in the integrated circuit. According to some embodiments, the passive layout device 1000 may be the layout of a tie-to-ground N-channel MOSFET or a tie-to-supply P-channel MOSFET.

FIG. 2-FIG. 6 illustrate five different types of active layout patterns while FIG. 7-FIG. 10 illustrate five different types of passive layout patterns. In a layout of an integrated circuit, the polysilicon path of an active layout pattern may connect to the polysilicon path of a passive layout pattern, wherein the polysilicon path of the active layout pattern is aligned with the polysilicon path of the passive layout pattern. The layout method 100 is used to find all the layout patterns in which the polysilicon path of the active layout pattern connects to the polysilicon path of the passive layout pattern. Then, the layout method 100 disposes a cut layer on the polysilicon path and nearby the boundary between the active layout device and the passive layout device. According to some embodiments, the cut layer may be a cut poly (CPO) layer. Accordingly, the passive layout device can be disconnected from the active layout device after fabrication.

Figure 11:
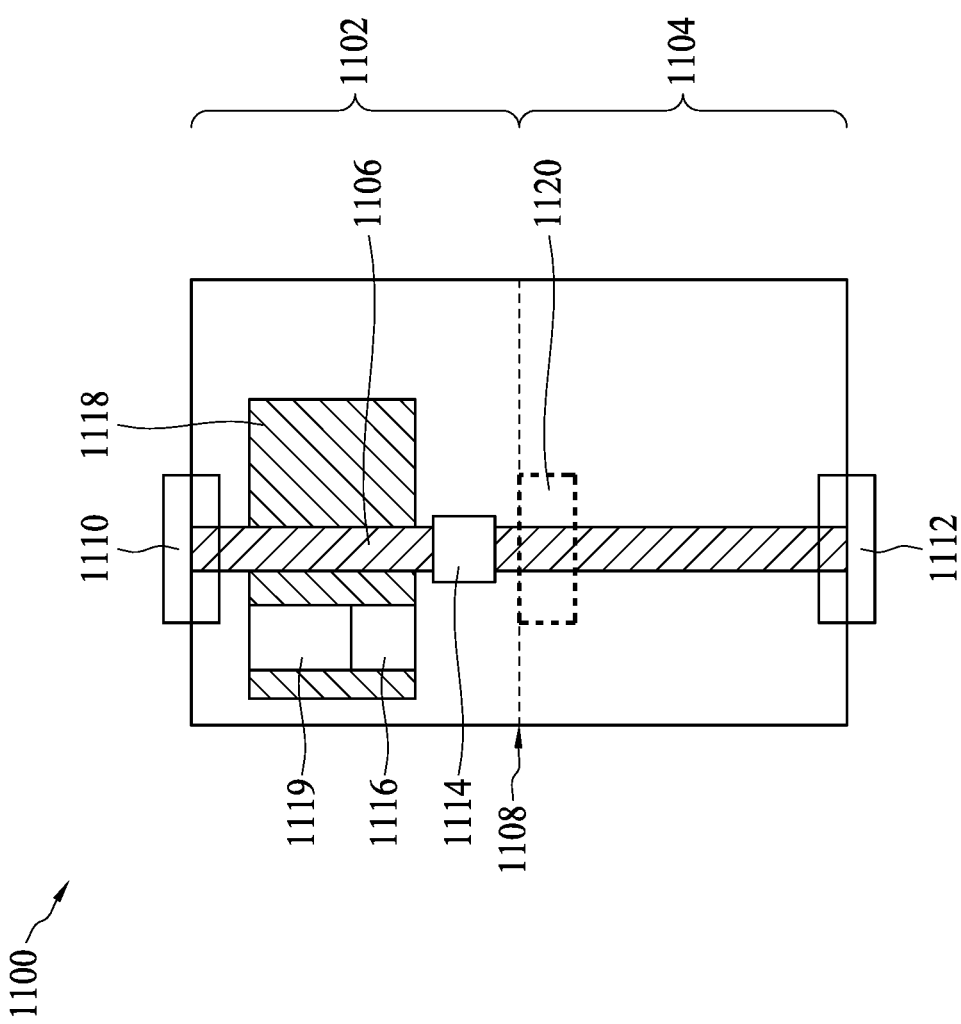
FIG. 11-FIG. 21 are diagrams illustrating circuit cell layouts according to some embodiments.

FIG. 11-FIG. 17 illustrating a plurality of circuit cell layouts that should be found in an integrated circuit by the layout method 100. The circuit cell layouts may be single height cell. FIG. 11 is a diagram illustrating a circuit cell layout 1100 according to some embodiments. The circuit cell layout 1100 comprises a first layout pattern 1102 and a second layout pattern 1104 abutting the first layout pattern 1102. A polysilicon path 1106 is disposed across a boundary 1108 of the first layout pattern 1102 and the second layout pattern 1104. According to some embodiments, a first cut poly layer 1110 is disposed on a first edge of the polysilicon path 1106, and a second cut poly layer 1112 is disposed on a second edge of the polysilicon path 1106. In the first layout pattern 1102, a contact layer 1114 is disposed on the polysilicon path 1106 for relaying a control signal to the polysilicon path 1106. When the integrated circuit is fabricated, a contact layer 1116 is arranged to relay signal between the diffusion area 1118 and the adjacent circuit (not shown) in response to the signal on the polysilicon path 1106 during the operation. A metal layer 1119 is coupled to the contact layer 1116 for conducting the relay signal. The first layout pattern 1102 is similar to the active layout device 300 in FIG. 3. The detailed description of the first layout pattern 1102 is omitted here for brevity. The second layout pattern 1104 is similar to the passive layout device 700 in FIG. 7. Therefore, the polysilicon path 1106 in the second layout pattern 1104 is a redundant polysilicon path. Accordingly, if the layout method 100 determines that the first layout pattern 1102 and the second layout pattern 1104 are the active layout pattern and the passive layout pattern, respectively, the layout method 100 disposes an additional cut poly layer 1120 on the polysilicon path 1106 and nearby by or on the boundary 1108 of the first layout pattern 1102 and the second layout pattern 1104. The cut poly layer 1120 is a mask for cutting the polysilicon path 1106 during the fabrication. After the fabrication, the portion of polysilicon path 1106 in the second layout pattern 1104 is disconnected from the portion of the polysilicon path 1106 in the first layout pattern 1102. Accordingly, the loading or the parasitic capacitor of the portion of the polysilicon path 1106 in the first layout pattern 1102 is reduced.

Figure 12:
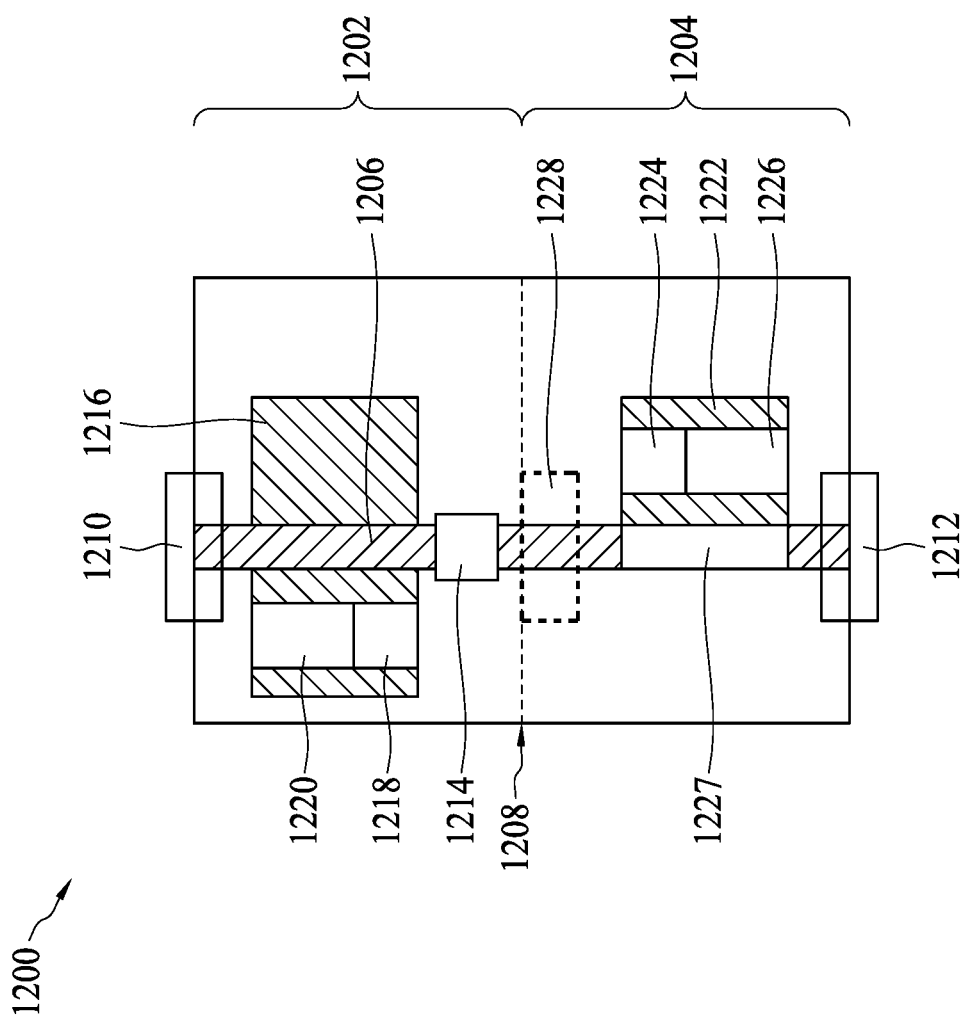

FIG. 12 is a diagram illustrating a circuit cell layout 1200 according to some embodiments. The circuit cell layout 1200 comprises a first layout pattern 1202 and a second layout pattern 1204 abutting the first layout pattern 1202. A polysilicon path 1206 is disposed across a boundary 1208 of the first layout pattern 1202 and the second layout pattern 1204. According to some embodiments, a first cut poly layer 1210 is disposed on a first edge of the polysilicon path 1206, and a second cut poly layer 1212 is disposed on a second edge of the polysilicon path 1206. The first layout pattern 1202 further comprises a contact layer 1214, a diffusion area 1216, a contact layer 1218, and a metal layer 1220. The first layout pattern 1202 is similar to the first layout pattern 1102 in FIG. 11. The detailed description of the first layout pattern 1202 is omitted here for brevity. The second layout pattern 1204 comprises a diffusion area 1222, a contact layer 1224, and a metal layer 1226. The polysilicon path 1206 is disposed on the edge 1227 of the diffusion area 1222. The contact layer 1224 is coupled to the diffusion area 1222. The metal layer 1226 is coupled to the contact layer 1224. The metal layer 1226 is not electrically coupled to an adjacent device (not shown) of the second layout pattern 1204. The second layout pattern 1204 is similar to the passive layout device 800 in FIG. 8. Therefore, the polysilicon path 1206 in the second layout pattern 1204 is a redundant polysilicon path. Accordingly, if the layout method 100 determines that the first layout pattern 1202 and the second layout pattern 1204 are the active layout pattern and the passive layout pattern, respectively, the layout method 100 disposes an additional cut poly layer 1228 on the polysilicon path 1206 and nearby by or on the boundary 1208 of the first layout pattern 1202 and the second layout pattern 1204 for cutting the polysilicon path 1206 during the fabrication. After the fabrication, the portion of the polysilicon path 1206 in the second layout pattern 1204 is disconnected from the portion of the polysilicon path 1206 in the first layout pattern 1202. Accordingly, the loading or the parasitic capacitor of the portion of the polysilicon path 1206 in the first layout pattern 1202 is reduced.

Figure 13:
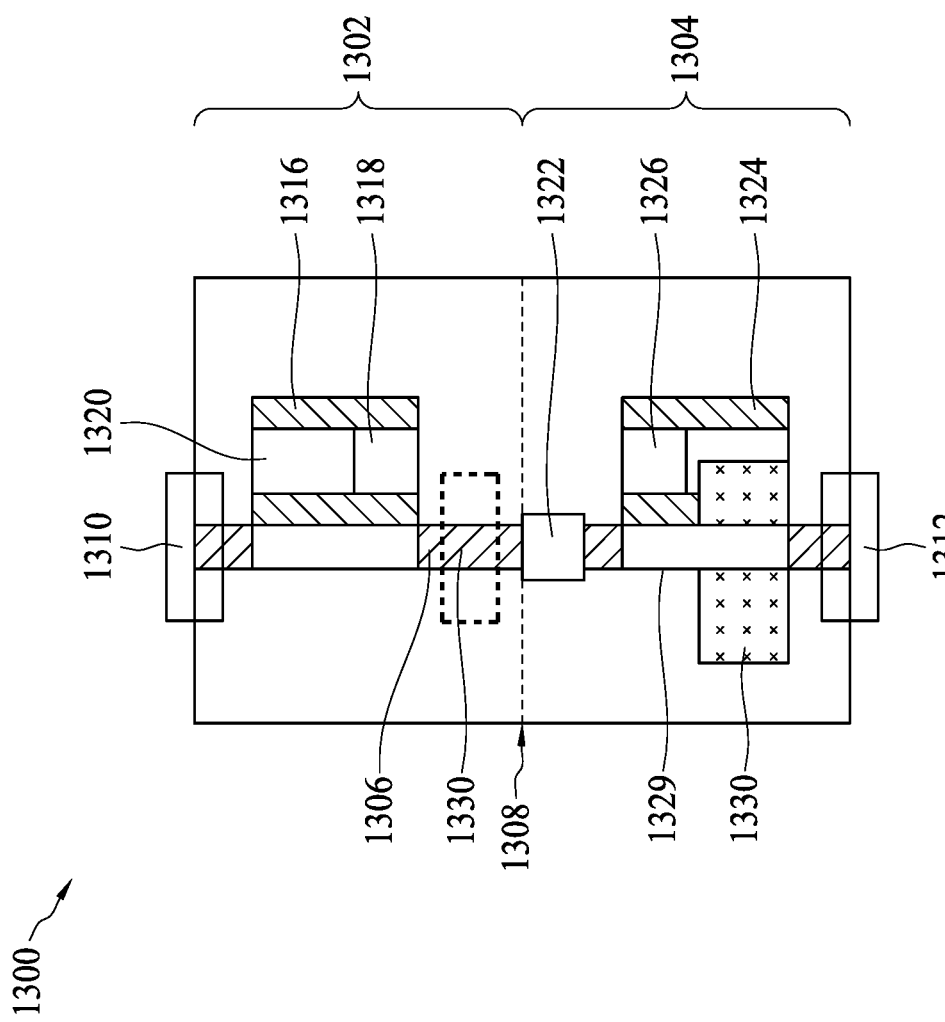

FIG. 13 is a diagram illustrating a circuit cell layout 1300 according to some embodiments. The circuit cell layout 1300 comprises a first layout pattern 1302 and a second layout pattern 1304 abutting the first layout pattern 1302. A polysilicon path 1306 is disposed across a boundary 1308 of the first layout pattern 1302 and the second layout pattern 1304. According to some embodiments, a first cut poly layer 1310 is disposed on a first edge of the polysilicon path 1306, and a second cut poly layer 1312 is disposed on a second edge of the polysilicon path 1306. The first layout pattern 1302 further comprises a diffusion area 1316, a contact layer 1318, and a metal layer 1320. The first layout pattern 1302 is similar to the second layout pattern 1204 in FIG. 12. The detailed description of the first layout pattern 1302 is omitted here for brevity. The second layout pattern 1304 comprises a contact layer 1322, a diffusion area 1324, a contact layer 1326, a metal layer 1328, and a metal poly (MP) layer 1330. The polysilicon path 1306 is disposed on the edge 1329 of the diffusion area 1324. The contact layer 1326 is coupled to the diffusion area 1324. The metal layer 1328 is coupled to the contact layer 1326. The metal layer 1328 is electrically coupled to an adjacent device (not shown) of the second layout pattern 1304 via the metal poly layer 1330. The second layout pattern 1304 is similar to the active layout device 600 in FIG. 6. Therefore, the polysilicon path 1306 in the first layout pattern 1302 is a redundant polysilicon path. Accordingly, if the layout method 100 determines that the first layout pattern 1302 and the second layout pattern 1304 are the passive layout pattern and the active layout pattern, respectively, the layout method 100 disposes an additional cut poly layer 1330 on the polysilicon path 1306 and nearby by or on the boundary 1308 of the first layout pattern 1302 and the second layout pattern 1304 for cutting the polysilicon path 1306 during the fabrication. After the fabrication, the portion of the polysilicon path 1306 in the first layout pattern 1302 is disconnected from the portion of the polysilicon path 1306 in the second layout pattern 1304. Accordingly, the loading or the parasitic capacitor of the portion of the polysilicon path 1306 in the second layout pattern 1304 is reduced.

Figure 14:
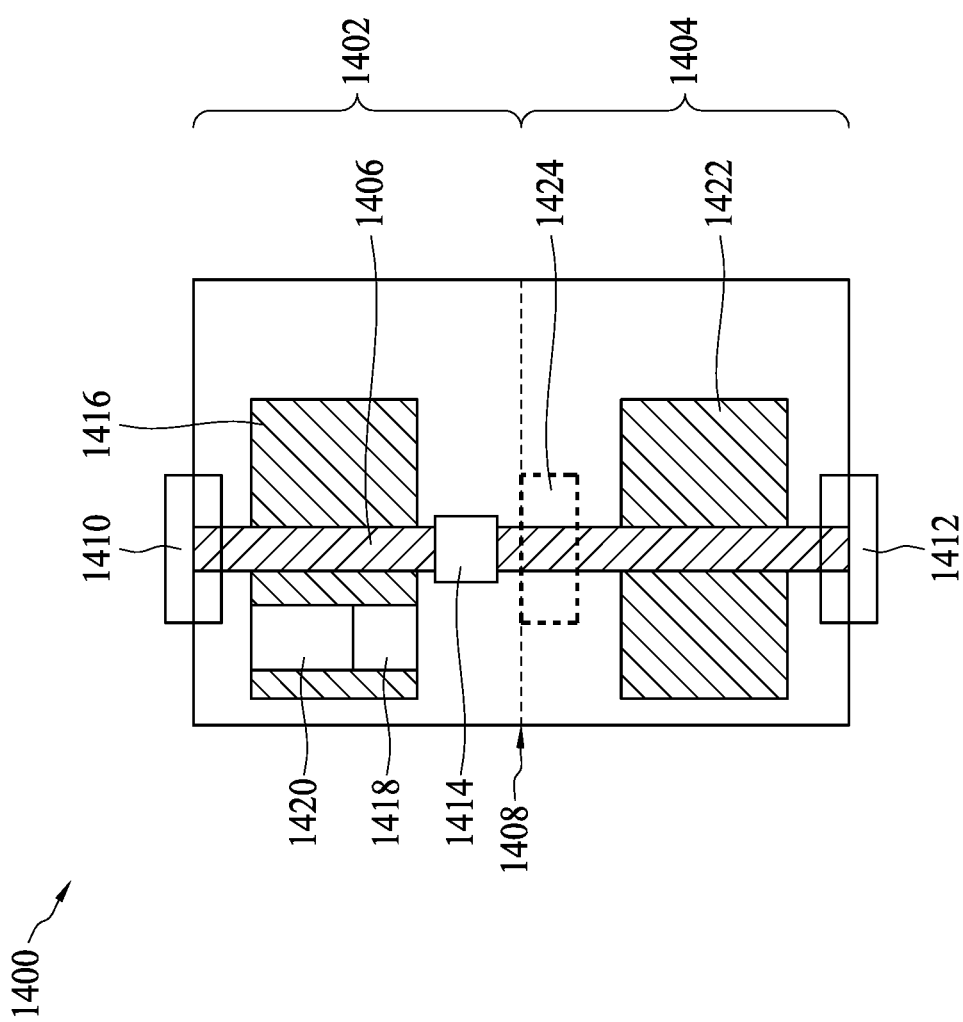

FIG. 14 is a diagram illustrating a circuit cell layout 1400 according to some embodiments. The circuit cell layout 1400 comprises a first layout pattern 1402 and a second layout pattern 1404 abutting the first layout pattern 1402. A polysilicon path 1406 is disposed across a boundary 1408 of the first layout pattern 1402 and the second layout pattern 1404. According to some embodiments, a first cut poly layer 1410 is disposed on a first edge of the polysilicon path 1406, and a second cut poly layer 1412 is disposed on a second edge of the polysilicon path 1406. The first layout pattern 1402 further comprises a contact layer 1414, a diffusion area 1416, a contact layer 1418, and a metal layer 1420. The first layout pattern 1402 is similar to the first layout pattern 1102 in FIG. 11. The detailed description of the first layout pattern 1402 is omitted here for brevity. The second layout pattern 1404 further comprises a diffusion area 1422. The second layout pattern 1404 is similar to the passive layout device 900 in FIG. 9. Therefore, the polysilicon path 1406 in the second layout pattern 1404 is a redundant polysilicon path. Accordingly, if the layout method 100 determines that the first layout pattern 1402 and the second layout pattern 1404 are the active layout pattern and the passive layout pattern, respectively, the layout method 100 disposes an additional cut poly layer 1424 on the polysilicon path 1406 and nearby by or on the boundary 1408 of the first layout pattern 1402 and the second layout pattern 1404 for cutting the polysilicon path 1406 during the fabrication. After the fabrication, the portion of the polysilicon path 1406 in the second layout pattern 1404 is disconnected from the portion of the polysilicon path 1406 in the first layout pattern 1402. Accordingly, the loading or the parasitic capacitor of the portion of the polysilicon path 1406 in the first layout pattern 1402 is reduced.

Figure 15:
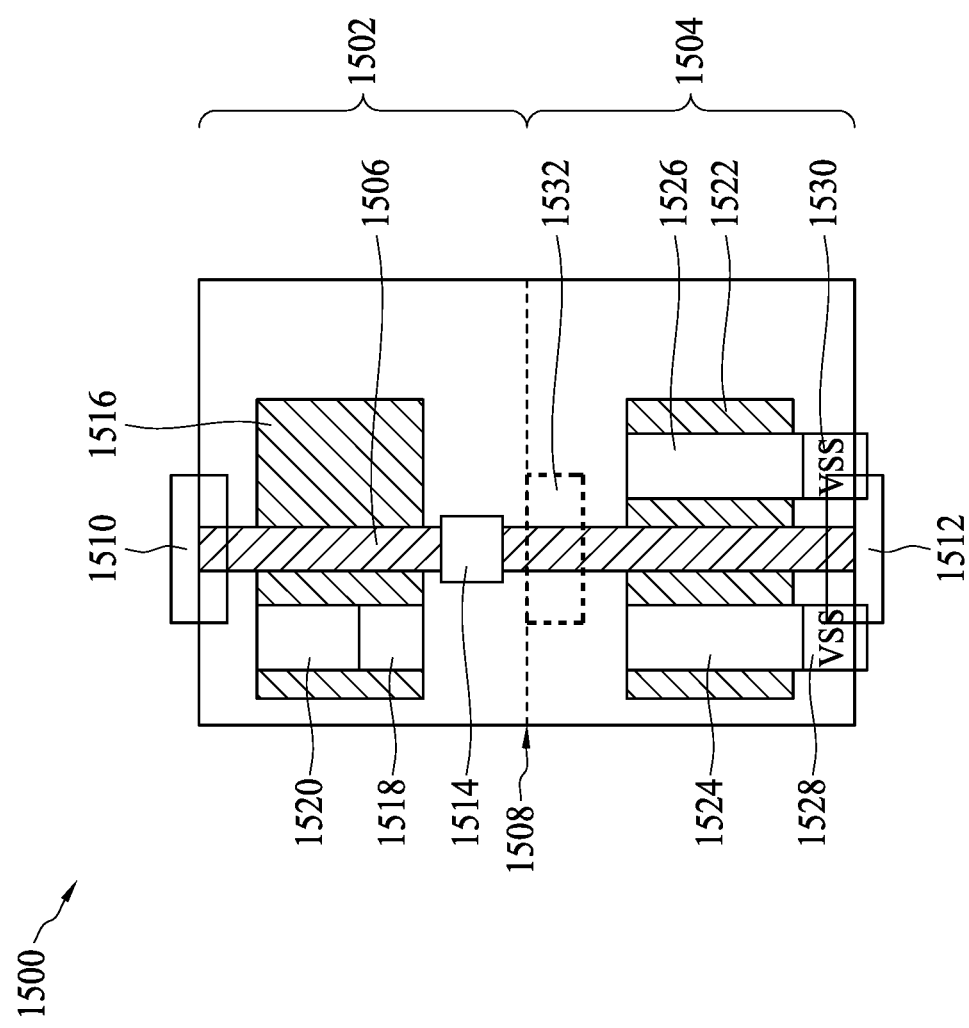

FIG. 15 is a diagram illustrating a circuit cell layout 1500 according to some embodiments. The circuit cell layout 1500 comprises a first layout pattern 1502 and a second layout pattern 1504 abutting the first layout pattern 1502. A polysilicon path 1506 is disposed across a boundary 1508 of the first layout pattern 1502 and the second layout pattern 1504. According to some embodiments, a first cut poly layer 1510 is disposed on a first edge of the polysilicon path 1506, and a second cut poly layer 1512 is disposed on a second edge of the polysilicon path 1506. The first layout pattern 1502 further comprises a contact layer 1514, a diffusion area 1515, a contact layer 1518, and a metal layer 1520. The first layout pattern 1502 is similar to the first layout pattern 1102 in FIG. 11. The detailed description of the first layout pattern 1502 is omitted here for brevity. The second layout pattern 1504 further comprises a diffusion area 1522, a first metal diffusion layer 1524, a second metal diffusion 1526, a first contact layer 1528, and a second contact layer 1530. 1524 and 1526 are located in same layer called MD layer. The first metal diffusion 1524 and the second metal diffusion 1526 are electrically coupled to the diffusion area 1522. The first contact layer 1528 and the second contact layer 1530 are electrically coupled to the first metal diffusion 1524 and the second metal diffusion 1526 respectively, and the first contact layer 1528 and the second contact layer 1530 are electrically coupled to a reference voltage (e.g. the ground voltage). The second layout pattern 1504 is similar to the passive layout device 1000 in FIG. 10. Therefore, the polysilicon path 1506 in the second layout pattern 1504 is a redundant polysilicon path. Accordingly, if the layout method 100 determines the first layout pattern 1502 and the second layout pattern 1504 are the active layout pattern and the passive layout pattern, respectively, the layout method 100 disposes an additional cut poly layer 1532 on the polysilicon path 1506 and nearby by or on the boundary 1508 of the first layout pattern 1502 and the second layout pattern 1504 for cutting the polysilicon path 1506 during the fabrication. After the fabrication, the portion of the polysilicon path 1506 in the second layout pattern 1504 is disconnected from the portion of the polysilicon path 1506 in the first layout pattern 1502. Accordingly, the loading or the parasitic capacitor of the portion of the polysilicon path 1506 in the first layout pattern 1502 is reduced.

Figure 16:
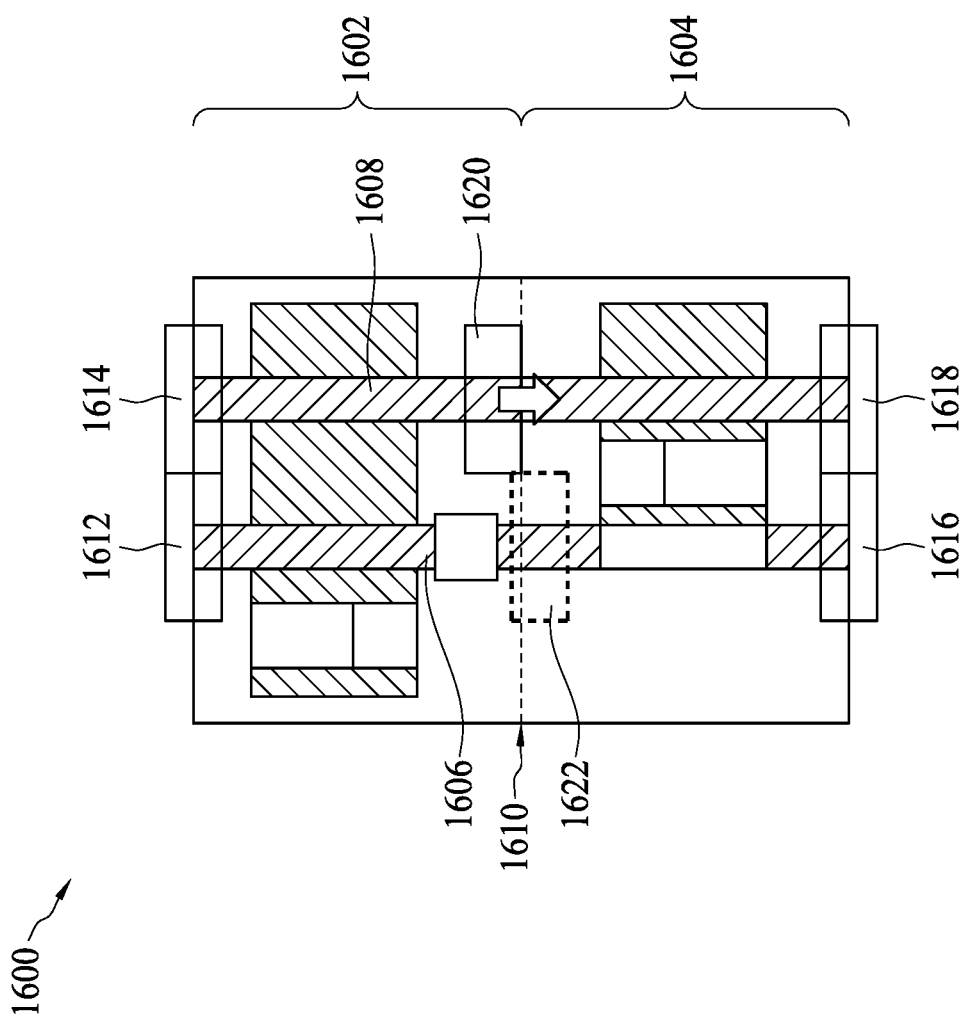

FIG. 16 is a diagram illustrating a circuit cell layout 1700 according to some embodiments. The circuit cell layout 1600 comprises a first layout pattern 1602 and a second layout pattern 1604 abutting the first layout pattern 1602. A first polysilicon path 1606 and a second polysilicon path 1608 are disposed across a boundary 1610 of the first layout pattern 1602 and the second layout pattern 1604. According to some embodiments, a first cut poly layer 1612 and a second cut poly layer 1614 are disposed on the first edges of the first polysilicon path 1606 and the second polysilicon path 1608, respectively. A third cut poly layer 1616 and a fourth cut poly layer 1618 are disposed on the second edges of the first polysilicon path 1606 and the second polysilicon path 1608, respectively. A fifth cut poly layer 1620 is disposed on the second polysilicon path 1608. It is assumed that the first layout pattern 1602 is an active layout pattern and the second layout pattern 1604 is a passive layout pattern. Then, when the layout method 100 disposes an additional cut poly layer 1622 on the first polysilicon path 1606 and nearby by or on the boundary 1610 of the first layout pattern 1602 and the second layout pattern 1604, the layout method 100 further moves the fifth cut poly layer 1620 to align with the additional cut poly layer 1622. Consequently, the fifth cut poly layer 1620 and the additional cut poly layer 1622 may be combined into a single cut poly layer to simplify the layout system. However, this is not a limitation of the present disclosure. The layout method 100 may moves the additional cut poly layer 1622 to align with the fifth cut poly layer 1620.

Figure 17:
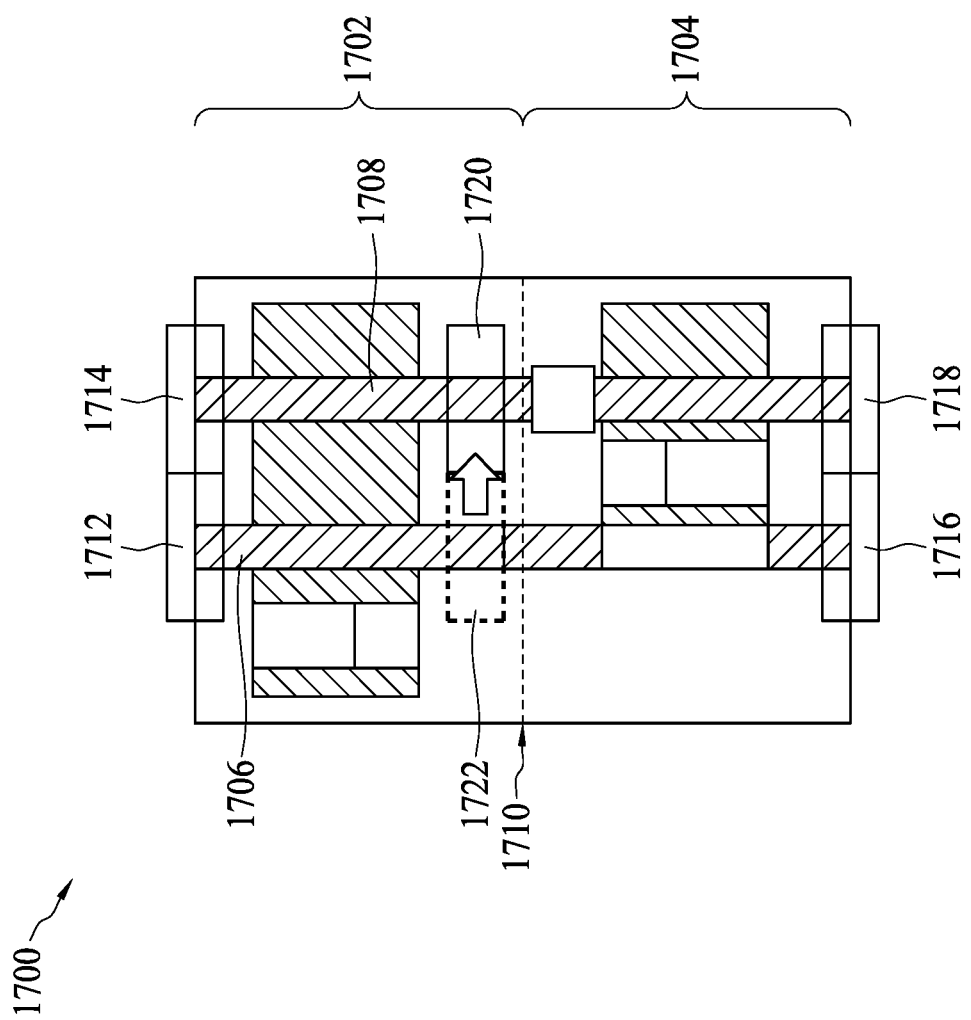

FIG. 17 is a diagram illustrating a circuit cell layout 1700 according to some embodiments. The circuit cell layout 1700 comprises a first layout pattern 1702 and a second layout pattern 1704 abutting the first layout pattern 1702. A first polysilicon path 1706 and a second polysilicon path 1708 are disposed across a boundary 1710 of the first layout pattern 1702 and the second layout pattern 1704. According to some embodiments, a first cut poly layer 1712 and a second cut poly layer 1714 are disposed on the first edges of the first polysilicon path 1706 and the second polysilicon path 1708, respectively. A third cut poly layer 1716 and a fourth cut poly layer 1718 are disposed on the second edges of the first polysilicon path 1706 and the second polysilicon path 1708, respectively. A fifth cut poly layer 1720 is disposed on the second polysilicon path 1708. It is assumed that the first layout pattern 1702 is a passive layout pattern and the second layout pattern 1704 is an active layout pattern. Then, when the layout method 100 disposes an additional cut poly layer 1722 on the first polysilicon path 1706 and nearby by or on the boundary 1710 of the first layout pattern 1702 and the second layout pattern 1704, the layout method 100 further moves the additional cut poly layer 1722 to align with the fifth cut poly layer 1720. Consequently, the additional cut poly layer 1722 and the fifth cut poly layer 1720 may be combined into a single cut poly layer to simplify the layout system.

Figure 18:
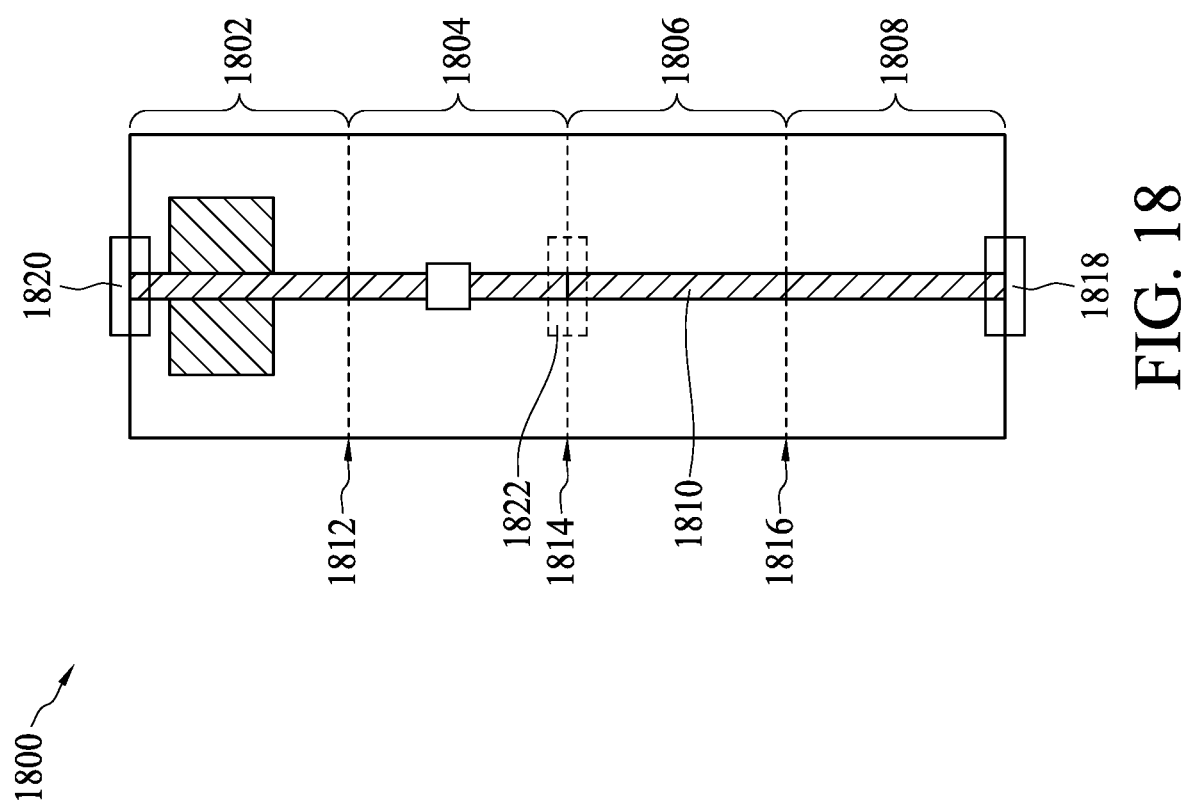

FIG. 18~FIG. 21 illustrating a plurality of multi-height circuit cell layouts that should be founded out in an integrated circuit by the layout method 100. FIG. 18 is a diagram illustrating a circuit cell layout 1800 according to some embodiments. The circuit cell layout 1800 comprises a first layout pattern 1802, a second layout pattern 1804, a third layout pattern 1806, and a fourth layout pattern 1808. The layout patterns 1802~1808 are abutting layout patterns. A polysilicon path 1810 is disposed across the boundaries 1812, 1814, and 1816 of the first layout pattern 1802, the second layout pattern 1804, the third layout pattern 1806, and the fourth layout pattern 1808. According to some embodiments, a first cut poly layer 1818 is disposed on a first edge of the polysilicon path 1810, and a second cut poly layer 1820 is disposed on a second edge of the polysilicon path 1810. According to some embodiments, it is assumed that the first layout pattern 1802 and the second layout pattern 1804 are active layout pattern, and the third layout pattern 1806 and the fourth layout pattern 1808 are passive layout pattern. Accordingly, when the layout method 100 determines the layout pattern type of the layout patterns 1802, 1804, 1806, and 1808, the layout method 100 may dispose an additional cut poly layer 1822 on the polysilicon path 1810 and nearby on or on the boundary 1814 between the second layout pattern 1804 and the third layout pattern 1806 for cutting the polysilicon path 1810 during the fabrication. After the fabrication, the portion of the polysilicon path 1810 in the second layout pattern 1804 and the third layout pattern 1806 is disconnected from the portion of the polysilicon path 1810 in the first layout pattern 1802 and the second layout pattern 1804. Accordingly, the loading or the parasitic capacitor of the portion of the polysilicon path 1810 in the first layout pattern 1802 and the second layout pattern 1804 is reduced.

Figure 19:
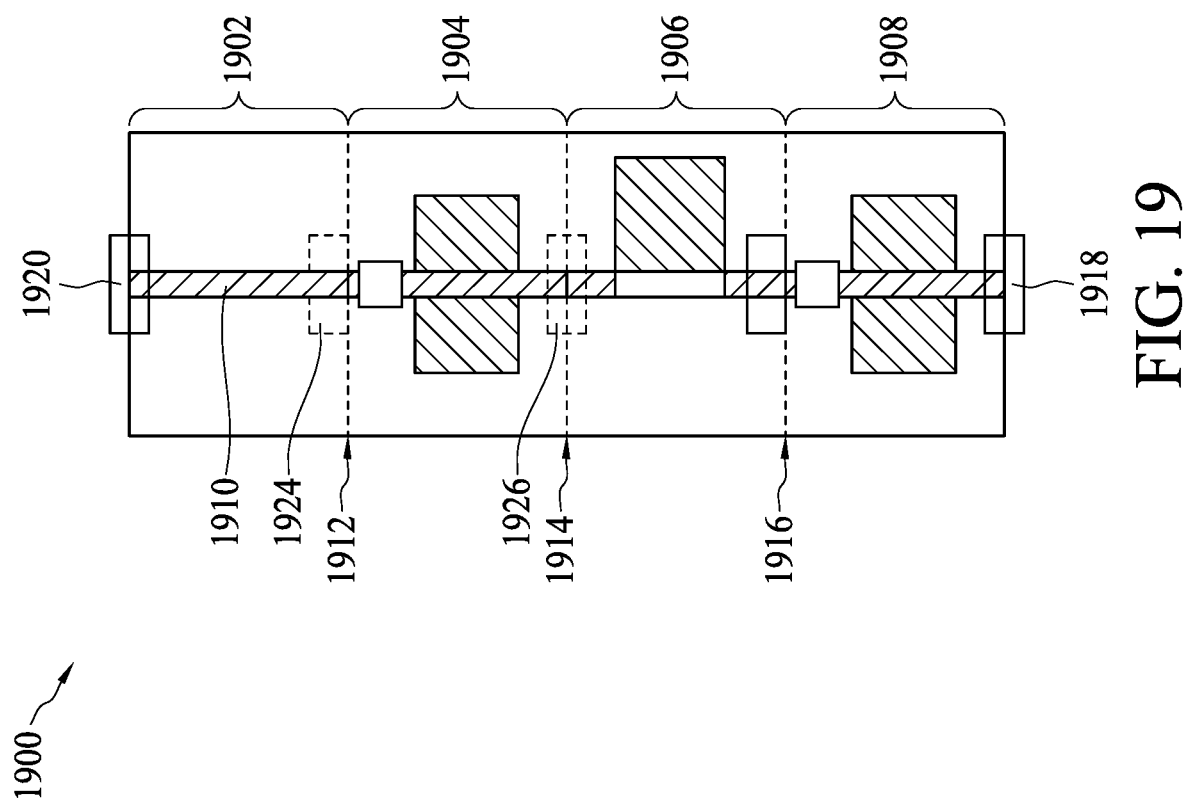

FIG. 19 is a diagram illustrating a circuit cell layout 1900 according to some embodiments. The circuit cell layout 1900 comprises a first layout pattern 1902, a second layout pattern 1904, a third layout pattern 1906, and a fourth layout pattern 1908. The layout patterns 1902~1908 are abutting layout patterns. A polysilicon path 1910 is disposed across the boundaries 1912, 1914, and 1916 of the first layout pattern 1902, the second layout pattern 1904, the third layout pattern 1906, and the fourth layout pattern 1908. According to some embodiments, a first cut poly layer 1918 is disposed on a first edge of the polysilicon path 1910, a second cut poly layer 1920 is disposed on a second edge of the polysilicon path 1910, and a third cut poly layer 1922 is disposed between the third layout pattern 1906 and the fourth layout pattern 1908. According to some embodiments, it is assumed that the first layout pattern 1902 and the third layout pattern 1906 are passive layout pattern, and the second layout pattern 1904 and the fourth layout pattern 1908 are active layout pattern. Accordingly, when the layout method 100 determines the layout pattern type of the layout patterns 1902, 1904, 1906, and 1908, the layout method 100 may dispose a first additional cut poly layer 1924 on the polysilicon path 1910 and nearby or on the boundary 1912 between the first layout pattern 1902 and the second layout pattern 1904, and dispose a second additional cut poly layer 1926 on the polysilicon path 1910 and nearby or on the boundary 1914 between the second layout pattern 1904 and the third layout pattern 1906 for cutting the polysilicon path 1910 during the fabrication. After the fabrication, the portion of the polysilicon path 1910 in the first layout pattern 1902 and the portion of the polysilicon path 1910 in the third layout pattern 1906 are disconnected from the portion of the polysilicon path 1910 in the second layout pattern 1904. Accordingly, the loading or the parasitic capacitor of the portion of the polysilicon path 1910 in the second layout pattern 1904 is reduced.

Figure 20:
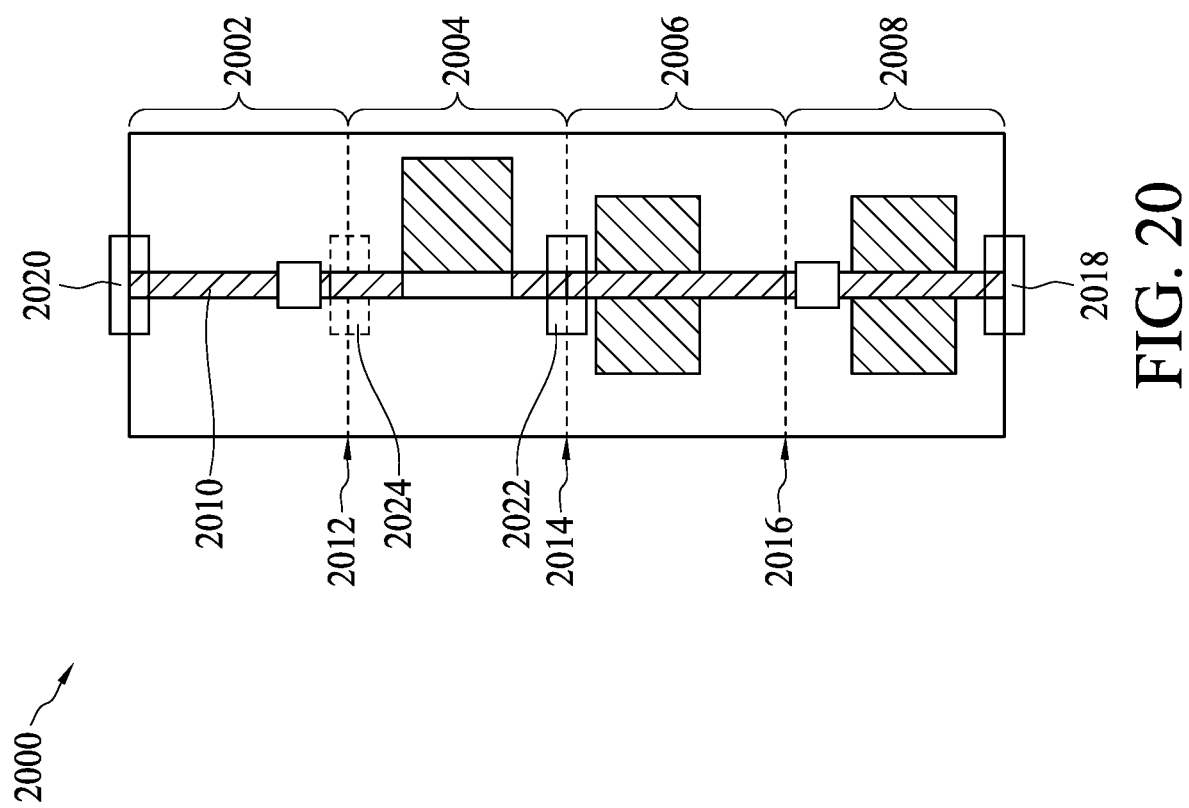

FIG. 20 is a diagram illustrating a circuit cell layout 2000 according to some embodiments. The circuit cell layout 2000 comprises a first layout pattern 2002, a second layout pattern 2004, a third layout pattern 2006, and a fourth layout pattern 2008. The layout patterns 2002~2008 are abutting layout patterns. A polysilicon path 2010 is disposed across the boundaries 2012, 2014, and 2016 of the first layout pattern 2002, the second layout pattern 2004, the third layout pattern 2006, and the fourth layout pattern 2008. According to some embodiments, a first cut poly layer 2018 is disposed on a first edge of the polysilicon path 2010, a second cut poly layer 2020 is disposed on a second edge of the polysilicon path 2010, and a third cut poly layer 2022 is disposed between the second layout pattern 2004 and the third layout pattern 2006. According to some embodiments, it is assumed that the first layout pattern 2002, the third layout pattern 2006, and the fourth layout pattern 2008 are active layout patterns, and the second layout pattern 2004 is a passive layout pattern. Accordingly, when the layout method 100 determines the layout pattern type of the layout patterns 2002, 2004, 2006, and 2008, the layout method 100 may dispose an additional cut poly layer 2024 on the polysilicon path 2010 and nearby or on the boundary 2012 between the first layout pattern 2002 and the second layout pattern 2004 for cutting the polysilicon path 2010 during the fabrication. After the fabrication, the portion of the polysilicon path 2010 in the second layout pattern 2004 is disconnected from the portion of the polysilicon path 2010 in the first layout pattern 2002. Accordingly, the loading or the parasitic capacitor of the portion of the polysilicon path 2010 in the first layout pattern 2002 is reduced.

Figure 21:
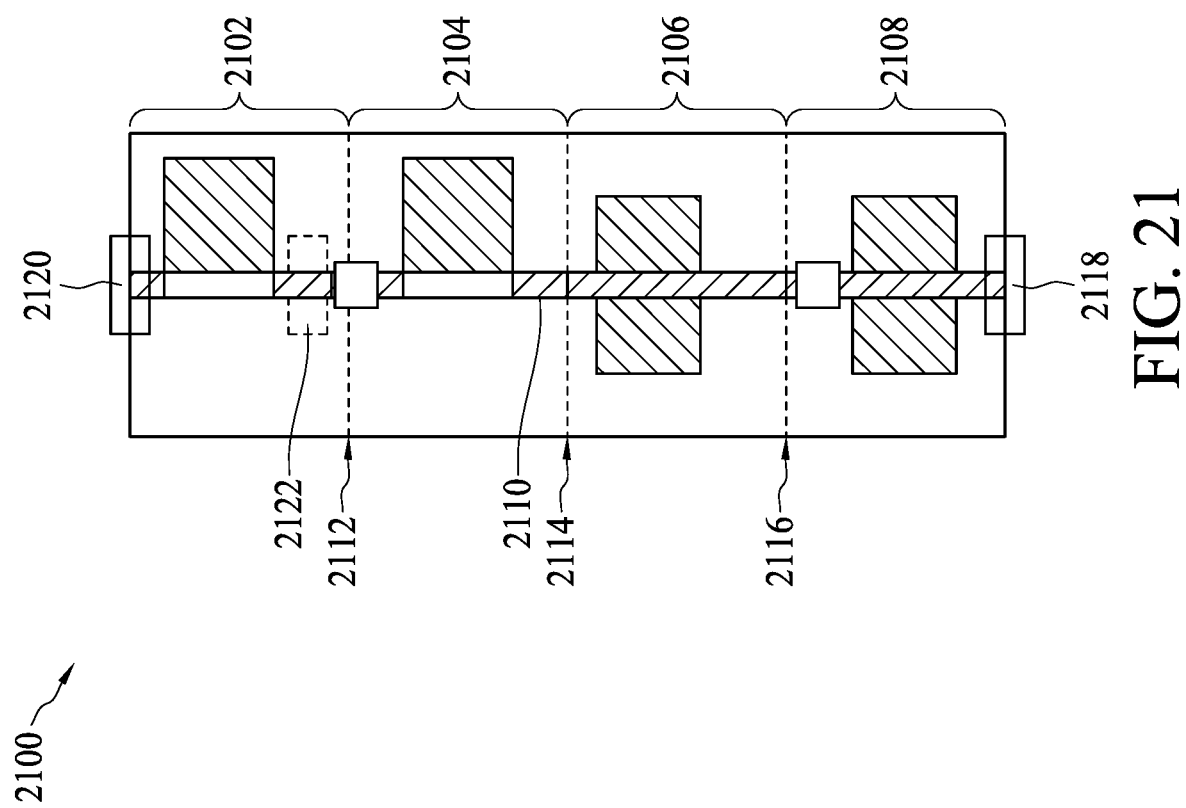

FIG. 21 is a diagram illustrating a circuit cell layout 2100 according to some embodiments. The circuit cell layout 2100 comprises a first layout pattern 2102, a second layout pattern 2104, a third layout pattern 2106, and a fourth layout pattern 2108. The layout patterns 2102~2108 are abutting layout patterns. A polysilicon path 2110 is disposed across the boundaries 2112, 2114, and 2116 of the first layout pattern 2102, the second layout pattern 2104, the third layout pattern 2106, and the fourth layout pattern 2108. According to some embodiments, a first cut poly layer 2118 is disposed on a first edge of the polysilicon path 2110, and a second cut poly layer 2120 is disposed on a second edge of the polysilicon path 2110. According to some embodiments, it is assumed that the first layout pattern 2102 is a passive layout pattern, and the second layout pattern 2104, the third layout pattern 2106, and the fourth layout pattern 2108 are active layout patterns. Accordingly, when the layout method 100 determines the layout pattern type of the layout patterns 2102, 2104, 2106, and 2108, the layout method 100 may dispose an additional cut poly layer 2122 on the polysilicon path 2110 and nearby or on the boundary 2112 between the first layout pattern 2102 and the second layout pattern 2104 for cutting the polysilicon path 2110 during the fabrication. After the fabrication, the portion of the polysilicon path 2110 in the first layout pattern 2102 is disconnected from the portion of the polysilicon path 2110 in the second layout pattern 2104, the third layout pattern 2106, and the fourth layout pattern 2108. Accordingly, the loading or the parasitic capacitor of the portion of the polysilicon path 2110 in the second layout pattern 2104, the third layout pattern 2106, and the fourth layout pattern 2108 is reduced.

Briefly, the layout method 100 is designed for automatically or manually determining all of the polysilicon connections of the active circuits and the redundant circuits in an integrated circuit, and disposing poly cut layers on the polysilicon connections. When all of the polysilicon paths of the redundant circuits are disconnected from the polysilicon paths of the active circuits after fabrication, the speed and the power consumption of the integrated circuit is improved.

Figure 22:
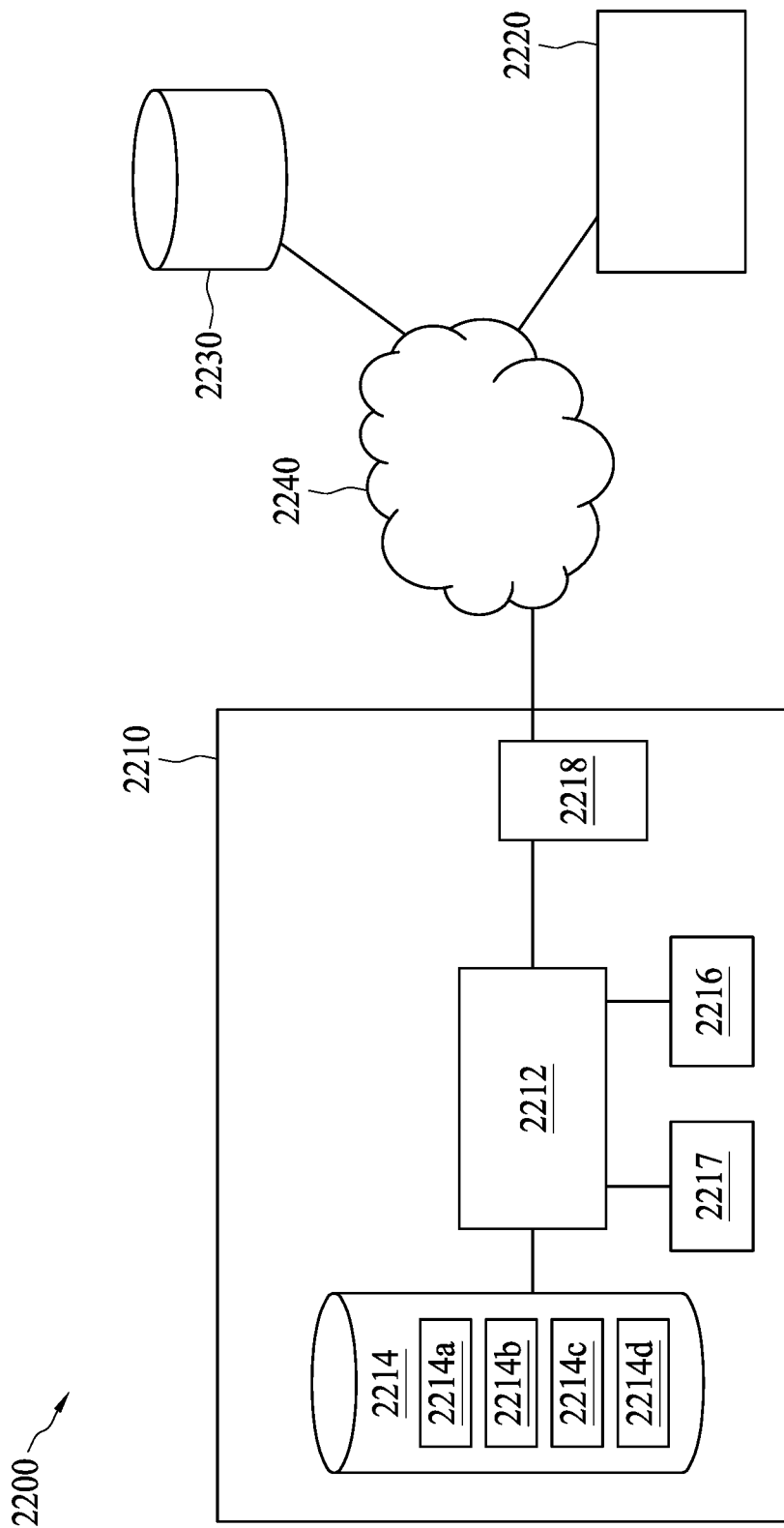
FIG. 22 is a functional block diagram of an integrated circuit design and modeling system in accordance with an embodiment.

FIG. 22 is a functional block diagram of an integrated circuit design and modeling system 2200 in accordance with an embodiment. Integrated circuit design and modeling system 2200 includes a first computer system 2210, a second computer system 2220, a networked storage device 2230, and a network 2240 connecting the first computer system 2210, the second computer system 2220, and the networked storage device 2230. In some embodiments, one or more of the second computer system 2220, the storage device 2230, and the network 2240 are omitted. In some embodiments, two or more of the first computer system 2210, second computer system 2220, and/or storage device 2230 are combined into a single computer system.

The first computer system 2210 includes a hardware processor 2212 communicatively coupled with a non-transitory, computer readable storage medium 2214 encoded with, i.e., storing, a generated integrated layout 2214*a*, a circuit design 2214*b*, a computer program code 2214*c*, i.e., a set of executable instructions, and a standard cell library 2214*d* having layout patterns as described herein. The processor 2212 is electrically and communicatively coupled with the computer readable storage medium 2214. The processor 2212 is configured to execute the set of instructions 2214*c* encoded in the computer readable storage medium 2214 in order to cause the computer 2210 to be usable as a placing and routing tool for generating a layout design based on the standard cell library 2214*d*. The processor 2212 is also configured to execute the set of instructions 2214*c* encoded in the computer readable storage medium 2214 in order to cause the computer 2210 to perform the operations 102~108 of the layout method 100.

In some embodiments, standard cell library 2214*d* is stored in a non-transitory storage medium other than storage medium 2214. In some embodiments, standard cell library 2214*d* is stored in a non-transitory storage medium in networked storage device 2230 or second computer system 2220. In such case, standard cell library 2214*d* is accessible by the processor 2212 through the network.

In some embodiments, the processor 2212 is a central processing unit (CPU), a multi-processor, a distributed processing system, an application specific integrated circuit (ASIC), and/or a suitable processing unit.

In some embodiments, the computer readable storage medium 2214 is an electronic, magnetic, optical, electromagnetic, infrared, and/or a semiconductor system (or apparatus or device). For example, the computer readable storage medium 2214 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 2214 includes a compact disk-read only memory (CD-ROM), a compact disk-read/write (CD-R/W), and/or a digital video disc (DVD).

The computer system 2210 includes, in at least some embodiments, an input/output interface 2216 and a display unit 2217. The input/output interface 2216 is coupled to the controller 2212 and allows the circuit designer to manipulate the first computer system 2210. In at least some embodiments, the display unit 2217 displays the status of executing the placing and routing tool 2214*a* in a real-time manner and provides a Graphical User Interface (GUI). In at least some embodiments, the input/output interface 2216 and the display 2217 allow an operator to operate the computer system 2210 in an interactive manner.

In some embodiments, a layout of an integrated circuit is disclosed. The layout comprises: a first layout device, a second layout device, a conductive path, and a cut layer. The second layout device is arranged to abut the first layout device at a boundary between the first layout device and the second layout device, wherein the second layout device is a redundant circuit in the integrated circuit. The conductive path is disposed across the boundary of the first layout device and the second layout device. The cut layer is disposed on the conductive path and nearby the boundary for disconnecting the first layout device from the second layout device by cutting the conductive path into a first conductive portion and a second conductive portion according to a position of the cut layer. The first layout device is a first layout pattern and the second layout device is a second layout pattern different from the first layout pattern In some embodiments, an integrated circuit is disclosed. The integrated circuit comprises: a first circuit device, a second circuit device, a first conductive path, and a second conductive path. The second circuit device is arranged to abut the first circuit device. The first conductive path is disposed across the first circuit device. The second conductive path is disposed across the second circuit device. The second layout device is a redundant circuit in the integrated circuit, the first circuit device is a first circuit pattern and the second circuit device is a second circuit pattern different from the first circuit pattern, the first conductive path is aligned with the second conductive path, and the first conductive path is disconnected from the second conductive path.

In some embodiments, a layout of an integrated circuit is disclosed. The layout comprises: a first layout device, a second layout device, a conductive path, and a cut layer. The second layout device is arranged to abut the first layout device at a boundary between the first layout device and the second layout device, wherein the second layout device is a passive layout device in the integrated circuit. The first conductive path is disposed across the boundary of the first layout device and the second layout device. The second conductive path is disposed across the boundary of the first layout device and the second layout device. The first cut layer is disposed on the first conductive path and nearby the boundary for disconnecting the first layout device from the second layout device by cutting the first conductive path into a first conductive portion and a second conductive portion according to a position of the first cut layer. The first layout device is a first layout pattern and the second layout device is a second layout pattern different from the first layout pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A layout of an integrated circuit, comprising:
   a first layout device;
   a second layout device abutting the first layout device at a boundary between the first layout device and the second layout device, wherein the second layout device is a redundant circuit in the integrated circuit;
   a conductive path disposed across the boundary of the first layout device and the second layout device; and
   a cut layer disposed on the conductive path and on the boundary for disconnecting the first layout device from the second layout device by cutting the conductive path into a first conductive portion and a second conductive portion according to a position of the cut layer;
   wherein the first layout device is a first layout pattern and the second layout device is a second layout pattern different from the first layout pattern.

2. The layout of claim 1, wherein the conductive path is a polysilicon path.

3. The layout of claim 1 wherein the first layout pattern corresponds to an active circuit in the integrated circuit, and the second layout pattern corresponds to the redundant circuit in the integrated circuit.

4. The layout of claim 1, wherein the first layout device comprises a first contact layer contacting the first conductive portion of the conductive path in the first layout device, and the second conductive portion of the conductive path in the second layout device does not contact a second contact layer different from the first contact layer.

5. The layout of claim 1, wherein the first layout device comprises a contact layer for coupling a first diffusion area of the first layout device to a third layout device adjacent to the first layout device, and a second diffusion area of the second layout device is a floating diffusion area.

6. The layout of claim 1, wherein the first layout device comprises a first contact layer for coupling a first diffusion area of the first layout device to a third layout device adjacent to the first layout device, and the second layout device comprises a second contact layer and a third contact layer for coupling a second diffusion area and a third diffusion area of the second layout device, respectively, to a reference voltage.

7. The layout of claim 1, wherein the first layout device comprises a first contact layer for coupling a diffusion area of the first layout device to a third layout device adjacent to the first layout device, and the second layout device comprises a second contact layer for contacting the conductive path to a reference voltage.

8. An integrated circuit, comprising:
   a first circuit device;
   a second circuit device abutting the first circuit device;
   a first conductive path disposed across the first circuit device; and
   a second conductive path disposed across the second circuit device;
   wherein the second circuit device is a redundant circuit in the integrated circuit, the first circuit device is a first circuit pattern and the second circuit device is a second circuit pattern different from the first circuit pattern, the first conductive path is aligned with the second conductive path, the first conductive path is disconnected from the second conductive path, and the first circuit device is disconnected from the second circuit device.

9. The layout of claim 8, wherein the first conductive path and the second conductive path are polysilicon paths.

10. The integrated circuit of claim 8, wherein the first circuit device comprises a first contact layer contacting the first conductive path in the first circuit device, and the second conductive path in the second circuit device is a floating conductive path.

11. The integrated circuit of claim 8, wherein the first circuit device comprises a contact layer for coupling a first diffusion area of the first circuit device to a third circuit device adjacent to the first circuit device, and a second diffusion area of the second circuit device is a floating diffusion area.

12. The integrated circuit of claim 8, wherein the first circuit device comprises a first contact layer for coupling a first diffusion area of the first circuit device to a third circuit device adjacent to the first circuit device, and the second circuit device comprises a second contact layer and a third contact layer for coupling a second diffusion area and a third diffusion area of the second circuit device, respectively, to a reference voltage.

13. The integrated circuit of claim 8, wherein the first circuit device comprises a first contact layer for coupling a diffusion area of the first circuit device to a third circuit device adjacent to the first circuit device, and the second circuit device comprises a second contact layer for contacting the second conductive path to a reference voltage.

14. A layout of an integrated circuit, comprising:
    a first layout device;

a second layout device abutting the first layout device at a boundary between the first layout device and the second layout device, wherein the second layout device is a passive layout device in the integrated circuit;

a first conductive path disposed across the boundary of the first layout device and the second layout device;

a second conductive path disposed across the boundary of the first layout device and the second layout device; and a first cut layer disposed on the first conductive path and on the boundary for disconnecting the first layout device from the second layout device by cutting the first conductive path into a first conductive portion and a second conductive portion according to a position of the first cut layer;

wherein the first layout device is a first layout pattern and the second layout device is a second layout pattern different from the first layout pattern.

15. The layout of claim 14, wherein the first layout pattern is active layout pattern, and the second layout pattern is passive layout pattern.

16. The layout of claim 14, wherein the first conductive path and the second conductive path are polysilicon paths.

17. The layout of claim 14, further comprising:

a second cut layer disposed on the second conductive path and nearby the boundary for disconnecting the first layout device from the second layout device by cutting the second conductive path into a third conductive portion and a fourth conductive portion according to a position of the second cut layer.

18. The layout of claim 17, wherein the second cut layer contacts with the first cut layer.

19. The layout of claim 17, wherein the second cut layer is aligned with the first cut layer.

20. The layout of claim 17, wherein the first cut layer and the second cut layer are masks used for cutting the first conductive path and the second conductive path.

\* \* \* \* \*